(12) United States Patent
Sjöland et al.

(10) Patent No.: US 10,320,338 B2
(45) Date of Patent: Jun. 11, 2019

(54) AMPLIFIER, FILTER, COMMUNICATION APPARATUS AND NETWORK NODE

(71) Applicant: Telefonaktiebolaget LM Ericsson (publ), Stockholm (SE)

(72) Inventors: Henrik Sjöland, Lund (SE); Mohammed Abdulaziz, Göteborg (SE); Waqas Ahmad, Lund (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 15/758,389

(22) PCT Filed: Sep. 30, 2015

(86) PCT No.: PCT/EP2015/072613
§ 371 (c)(1),
(2) Date: Mar. 8, 2018

(87) PCT Pub. No.: WO2017/054864
PCT Pub. Date: Apr. 6, 2017

(65) Prior Publication Data
US 2018/0241359 A1    Aug. 23, 2018

(51) Int. Cl.
*H03F 1/32* (2006.01)
*H03F 3/45* (2006.01)
(Continued)

(52) U.S. Cl.
CPC ............ *H03F 1/3211* (2013.01); *H03F 1/22* (2013.01); *H03F 1/223* (2013.01); *H03F 3/195* (2013.01);
(Continued)

(58) Field of Classification Search
USPC .......................................... 330/252–261, 311
See application file for complete search history.

(56) References Cited

U.S. PATENT DOCUMENTS 6,515,547 B2 * 2/2003 Sowlati ................... H03F 1/223
330/277
7,352,241 B2 * 4/2008 Lee ....................... H03F 3/45188
330/254
(Continued)

FOREIGN PATENT DOCUMENTS

| GB | 2306261 A | 4/1997 |
| WO | 2009026413 A1 | 2/2009 |
| WO | 2011019850 A1 | 2/2011 |

OTHER PUBLICATIONS

Yang, S-H, et al., "A Novel CMOS Operational Transconductance Amplifier Based on a Mobility Compensation Technique," IEEE Transactions on Circuits and Systems—II: Express Briefs, vol. 52, No. 1, Jan. 1, 2005, pp. 37-42.

*Primary Examiner* — Hieu P Nguyen
(74) *Attorney, Agent, or Firm* — Coats & Bennett, PLLC

(57) ABSTRACT

A differential amplifier comprises a first differential circuitry structure including a first part comprising at least one branch of transistors and a second part comprising at least one branch of transistors, and a second circuitry structure. The second circuitry structure has a first non-linear device and a second non-linear device. The non-linear devices each comprise a transistor having a control node connected to a differential output terminals of the differential amplifier. A common center node of the non-linear devices is connected to a control node of one of the transistors of each branch of the first part having a differential output terminal. Amplifier applications, communication devices and network nodes are also disclosed.

14 Claims, 7 Drawing Sheets

(51) Int. Cl.
*H03H 11/04* (2006.01)
*H03F 3/213* (2006.01)
*H03F 1/22* (2006.01)
*H03F 3/195* (2006.01)
*H04W 84/04* (2009.01)

(52) U.S. Cl.
CPC ......... *H03F 3/213* (2013.01); *H03F 3/45179* (2013.01); *H03F 3/45394* (2013.01); *H03H 11/0466* (2013.01); *H03F 2200/129* (2013.01); *H03F 2200/294* (2013.01); *H03F 2200/451* (2013.01); *H03F 2200/75* (2013.01); *H03F 2201/3215* (2013.01); *H03F 2203/45024* (2013.01); *H03F 2203/45288* (2013.01); *H04W 84/042* (2013.01)

(56) References Cited

U.S. PATENT DOCUMENTS

| | | | |
|---|---|---|---|
| 7,541,875 B2 * | 6/2009 | Taylor | H03F 1/223 330/133 |
| 2005/0052891 A1 | 3/2005 | Kim et al. | |
| 2007/0229154 A1 | 10/2007 | Kim et al. | |
| 2008/0048780 A1 | 2/2008 | Kim et al. | |
| 2009/0153244 A1 | 6/2009 | Cabanillas et al. | |
| 2009/0219092 A1 | 9/2009 | Kim et al. | |
| 2011/0115559 A1 | 5/2011 | Amrutur et al. | |

* cited by examiner

AMPLIFIER, FILTER, COMMUNICATION APPARATUS AND NETWORK NODE

TECHNICAL FIELD

The present invention generally relates to a differential amplifier, amplifier and filter applications using such differential amplifier, and communication apparatus and network node using such differential amplifier or amplifier and filter applications. In particular, the invention relates to linearization of differential amplifiers.

BACKGROUND

Third harmonic distortion produced by amplifiers is normally desired to be reduced. A non-linear feedback structure may be provided. US 2011/0115559 discloses a non-linear differential amplifier with such a structure where a function generator is connected to a non-linear feedback circuit, which is coupled to the non-linear differential amplifier in a negative feedback configuration by the non-linear feedback circuit being connected to an input node of the non-linear differential amplifier. A computer is used to calculate values for biasing the non-linear feedback circuit, where the computer simulates a model of the non-linear differential amplifier. The computer further provides control information to the function generator, which delivers voltage signals according to calculations of the computer to input nodes of feedback transistors of the non-linear feedback circuit.

Power consumption, robustness, cost, etc. are issues for many circuit designs. It is therefore a desire to provide a solution for linearization of an amplifier that provides an improvement for at least one of those issues.

SUMMARY

The invention is based on the understanding that linearization may be provided by providing feedback of output signals of an amplifier through a non-linear element which affects output stages of the amplifier.

According to a first aspect, there is provided a differential amplifier comprising a first differential circuitry structure including a first part comprising at least one branch of transistors and a second part comprising at least one branch of transistors, and a second circuitry structure. The second circuitry structure has a first non-linear device connected between a signal point of a branch of the first part having a first differential input terminal of the differential amplifier and a common centre node of the second circuitry structure. The second circuitry structure further has a second non-linear device connected between a signal point of a branch of the second part having a second differential input terminal of the differential amplifier and the common centre node. The first non-linear device comprises a transistor having a control node connected to a first differential output terminal of the differential amplifier, wherein the first differential output terminal provides an inverted output in relation to the first differential input terminal. The second non-linear device comprises a transistor having a control node connected to a second differential output terminal of the differential amplifier, wherein the second differential output terminal provides an inverted output in relation to the second differential input terminal. The common centre node is connected to a control node of one of the transistors of the branch of the first part having one of the differential output terminals and connected to a control node of one of the transistors of the branch of the second part having the other differential output terminal.

The first non-linear device may comprise a first MOS transistor, wherein the connection to the signal point of the branch of the first part having the first differential input terminal is a connection of a first node of the first MOS transistor, the connection to the common centre node is a connection of a second node of the first MOS transistor, and the transistor having the control node is the first MOS transistor having its gate connected to one of the differential output terminals. The second non-linear device may comprise a second MOS transistor, wherein the connection to the signal point of the branch of the second part having the second differential input terminal is a connection of a first node of the second MOS transistor, the connection to the common centre node is a connection of a second node of the second MOS transistor, and the transistor having the control node is the second MOS transistor having its gate connected to the other differential output terminal. The first and second MOS transistors may be operated in triode region.

The first part may comprise a branch of a cascoded first transistor and second transistor and biasing circuitry. The second part may comprise a branch with a cascoded first transistor and second transistor and biasing circuitry. The first and second differential input terminals may be provided at control nodes of the first transistors, respectively. The common centre node may be connected to control nodes of the second transistors.

The differential amplifier may be configured as a balanced operational transconductance amplifier. The first part may comprise a branch comprising an input transistor arrangement for the first differential input terminal and a further transistor. The first non-linear device may be connected to the signal point at a point between the input transistor arrangement and the further transistor of that branch. The first part may comprise another branch comprising a first transistor and a second transistor wherein the first differential output terminal is provided between the first and second transistors. The second part may comprise a branch comprising an input transistor arrangement for the second differential input terminal and a further transistor. The second non-linear device may be connected to the signal point a point between the input transistor arrangement and the further transistor of that branch. The second part may comprise another branch comprising a first transistor and a second transistor. The second differential output terminal may be provided between the first and second transistors. The control nodes of the transistors to which the common centre node is connected may be control nodes of the first transistors of the another branches of the first and second parts.

The branch may be a series connection of elements between a supply voltage node and a reference voltage node. The reference voltage node may be a ground node.

According to a second aspect, there is provided a low-noise amplifier comprising the differential amplifier according to the first aspect configured as a complementary amplifier, a feedback network connected between inputs and outputs of the differential amplifier.

According to a third aspect, there is provided a filter comprising a plurality of differential amplifiers according to the first aspect.

The differential amplifiers may be configured as operational transconductance amplifiers, and the filter may be arranged to comprise one or more biquad structures employing the operational transconductance amplifiers.

According to a fourth aspect, there is provided a power amplifier comprising a driver stage, wherein the driver stage comprises a differential amplifier according to the first aspect.

According to a fifth aspect, there is provided a communication apparatus configured to operate in a cellular communication system and comprising radio circuitry therefor. The radio circuitry comprises a differential amplifier according to the first aspect.

According to a sixth aspect, there is provided a network node configured to operate in a cellular communication system and comprising radio circuitry therefor. The radio circuitry comprises a differential amplifier according to the first aspect.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings.

DETAILED DESCRIPTION

Figure 1:
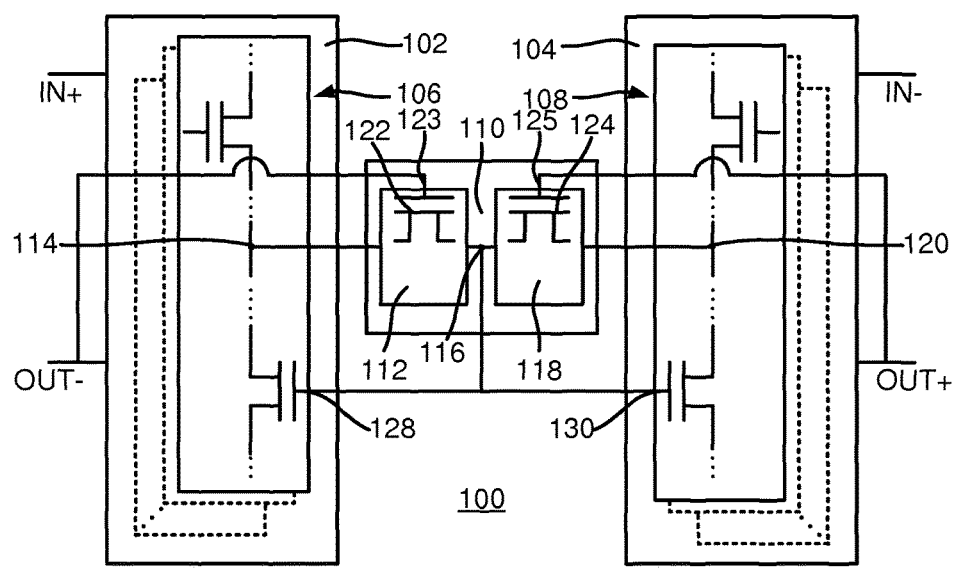
FIG. 1 schematically illustrates an amplifier according to embodiments.

FIG. 1 schematically illustrates an amplifier 100 according to embodiments. The amplifier 100 is a differential amplifier comprising a first differential circuitry structure including a first part 102. The first part 102 comprises at least one branch 106 of transistors and a second part 104 comprising at least one branch 108 of transistors for forming the differential amplifier. The first and second parts 102, 104 may be designed in a number of ways depending on desired properties of the amplifier 100. A few examples will be given with reference to FIGS. 3 to 7, but from this disclosure it is readily understood that the benefits demonstrated below may be achieved from other designs of the first and second parts 102, 104. The amplifier 100 further comprises a second circuitry structure 110 which provides the feedback from output signals through non-linear devices 112, 118 which affects output stages of the amplifier 100. The second circuitry structure 110 thus comprises the first non-linear device 112 which is connected between a signal point 114 of a branch of the first part 102 having a first differential input terminal of the differential amplifier 100 and a common centre node 116 of the second circuitry structure 110. In a similar way, the second non-linear device 118 is connected between a signal point 120 of a branch of the second part 104 having a second differential input terminal of the differential amplifier and the common centre node 116. Thus, from each of the parts 102, 104 there is a signal component corresponding to the signal to be amplified provided to the non-linear devices 112, 118, respectively. The first non-linear device 112 comprises a transistor 122 having a control node 123 which is connected to a first differential output terminal of the differential amplifier 100. Here, to provide a proper feedback function, the first differential output terminal is the one that provides an inverted output in relation to the first differential input terminal. Similarly, the second non-linear device 118 comprises a transistor 124 having a control node 125 connected to a second differential output terminal of the differential amplifier 100, and the second differential output terminal provides an inverted output in relation to the second differential input terminal. The common centre node 116 is connected to a control node 128 of one of the transistors of the branch of the first part 102 having one of the differential output terminals. The common centre node 116 holds a non-linearity of the signal. The control node 128 is thus affected wherein the linearization effect is achieved at the output. Similarly, the common centre node 116 is connected to a control node 130 of one of the transistors of the branch of the second part 104 having the other differential output terminal for the same reason. Here it should be noted that FIG. 1 for the sake of easier illustration and understanding illustrates that the signal points 114, 120 are at the same branch 106, 108 as the transistors having the control nodes 128, 130. This need however, as is demonstrated above, not be the case.

It should be noted that the term "terminal" in this disclosure is used both in the sense of a physical terminal for connecting a device or unit, and in the sense of an internal connection point suitable for connections between functional and/or structural blocks or units.

The linearization technique poses essentially no current overhead and only limited overhead in chip area and noise. Third order nonlinearity is efficiently reduced. The symmetry of the connecting the voltage of the common centre node 116 provides for pure even order nonlinearity, which is predominantly of second order. By applying that to the control nodes 128, 130 of transistors at output branches, the third order nonlinearity will be reduced.

It should be further noted that the in the illustrations of this disclosure, components for tuning, trimming, etc. are omitted not to obscure the gist of the contribution by this disclosure.

Figure 2:
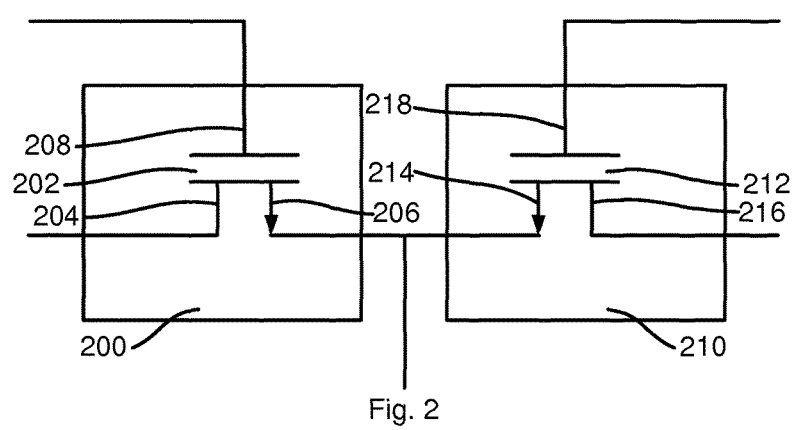
FIG. 2 illustrates a circuit structure for amplifier linearization according to an embodiment.

FIG. 2 illustrates a circuit structure for amplifier linearization according to an embodiment. The circuit structure comprises a first non-linear device 200 and a second non-linear device 210. Here, it should be noted that the illustrated and demonstrated circuit structure shows the very basic principle for the circuit structure, and further arrangements may be added for providing the non-linear devices 200, 210. However, also this basic structure provides for efficient reduction of third order nonlinearity, and is very efficient in view of the limited circuit area consumed. The first non-linear device 200 comprises a first MOS transistor 202, wherein the connection to the signal point of the branch of the first part, as demonstrated above, is a connection of a first node 204 of the first MOS transistor 202, the connection to the common centre node is a connection of a second node 206 of the first MOS transistor 202, and the transistor having the control node which is connected to one of the outputs as demonstrated above is the first MOS transistor 202 having its gate 208 connected to one of the differential output terminals. Here, the first and second nodes of the transistor 202 may act as drain and source, respectively, depending on voltage across the first and second nodes and the type of MOS transistor. Similarly, the second non-linear device 210 comprises a second MOS transistor 212 where the connection to the signal point 120 of the branch of the second part is a connection of a first node 216 of the second MOS transistor 212, the connection to the common centre node is a connection of a second node 214 of the second MOS transistor 212, and the second MOS transistor 212 has its gate 218 connected to the other differential output terminal. Also here, the first and second nodes of the transistor 212 may act as drain and source, respectively, depending on voltage across the first and second nodes and type of MOS transistor.

Thus, the outputs provide control to the transistors 202, 212, which are fed by a signal representing the signal to be amplified by the amplifier, and at the common source point, i.e. the common centre node, the predominantly second order nonlinearity is achieved. That is, the transistors 202, 212 operate as multipliers wherein the second order nonlinearity is achieved at the common centre node. It has been found beneficiary to operate the transistors 202, 212 in the triode region for achieving a good nonlinear impedance that has higher resistance when signals from the outputs are high, which increases the gain for large signals, helping counteracting third order compressive distortion.

Figure 3:
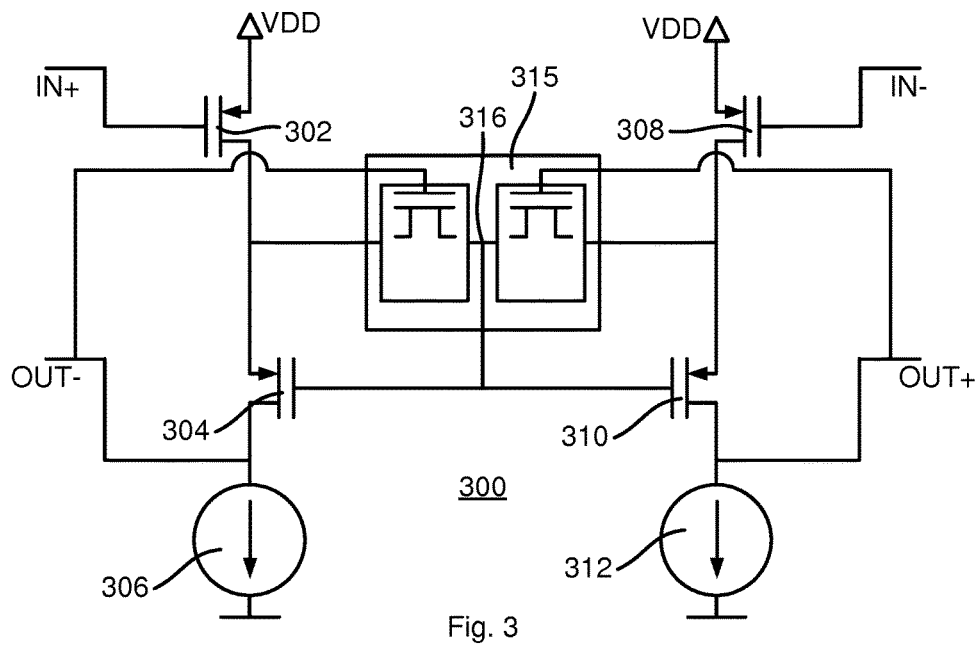
FIG. 3 schematically illustrates an amplifier according to an embodiment.

FIG. 3 schematically illustrates an amplifier 300 according to an embodiment. As can be seen from FIG. 3, the amplifier comprises a cascode common source stage. Thus, the first differential circuitry structure with the first part comprises a branch of cascoded transistors 302, 304 and the second part comprising a branch of cascoded transistors 308, 310. The branches also comprised biasing circuitry 306, 312, respectively. The second circuit structure 315 has the common centre point 316 connected to the gates of transistors 304, 310, while the signal input is connected to the gates of transistors 302, 308, i.e. respective positive and negative differential input.

A discussion about the function will now be provided. Consider that the second circuit 315 is the one demonstrated with reference to FIG. 2. The cascode preferably operates in the active region, while the second circuit structure may operate in the triode region, as demonstrated with reference to FIG. 2.

It is easy to see that transistors 304, 310 act as a source follower amplifier and the second order nonlinearity is directly fed to the drains of the transistors 302, 308. The total third order transconductance of the amplifier ($G_{m3}$) is now modified by the cross term $g_{ds1}^{M1} \times g_{m1}^{M1}$ where $g_{ds1}^{M1}$ and $g_{m1}^{M1}$ are the drain-source conductance and the transconductance of transistors 302, 308, respectively. This is because a scaled voltage of ($V_{in}^2$) appears at the drain of transistors 302, 308, and the cross term $g_{ds1}^{M1} \times g_{m1}^{M1}$ in the transistor equation does not only generate second order term as is the case without linearization but also third order term that has opposite sign. Optimally this leads to third order nonlinearity cancellation with proper biasing of the gates of the transistors.

This is very attractive solution since the second circuit structure 315 can be chosen to be very small, e.g. as of FIG. 2, and to not load the circuit leaving the noise performance intact and cascode devices can be tuned to get high linearity. To prove the effectiveness of the technique a more traditional amplifier with complementary cascodes and resistive feedback forming a wideband low-noise amplifier (LNA) will be demonstrated with reference to FIG. 5.

Figure 4:
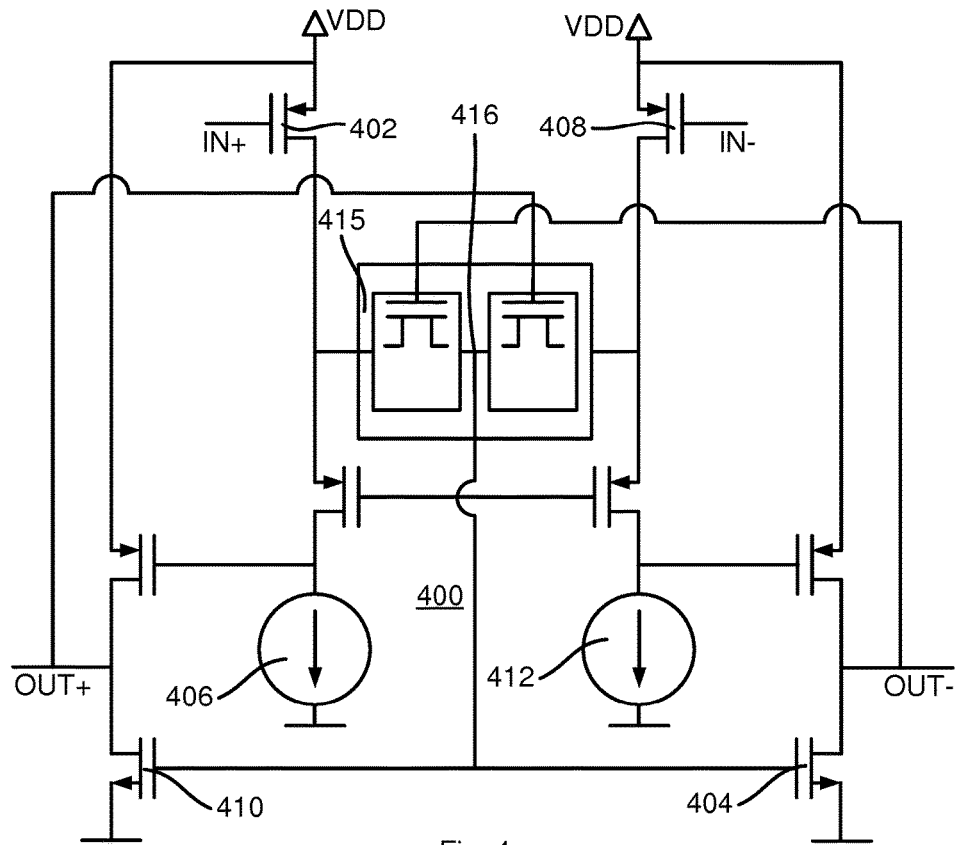
FIG. 4 schematically illustrates an amplifier according to an embodiment.
Figure 5:
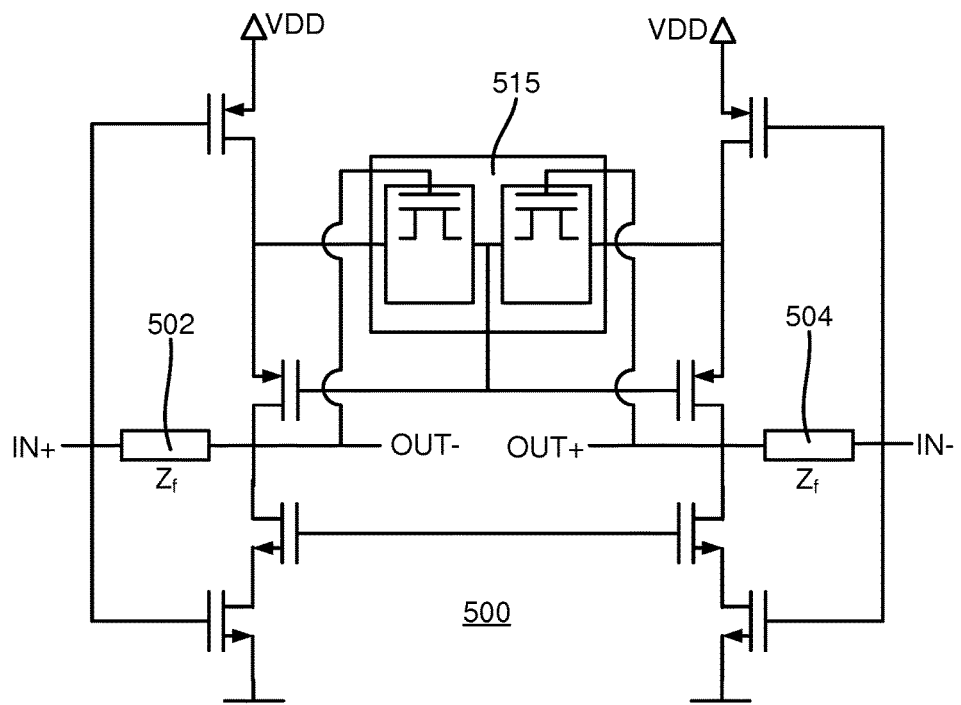
FIG. 5 illustrates a low-noise amplifier according to an embodiment.

FIG. 4 schematically illustrates an amplifier 400 according to an embodiment. The amplifier 400 have some similarities with the amplifier 300 demonstrated with reference to FIG. 3, but the amplifier 400 comprises a further stage forming another pair of branches. Thus, the first differential circuitry structure with the first part comprises a first branch of cascoded transistors including transistor 402 to which one of the differential inputs is connected. The second part comprises a branch of cascoded transistors including transistor 408 to which the other one of the differential inputs is connected. The branches also comprised biasing circuitry 406, 412, respectively. The further stage forming the another pair of branches provides the output, wherein the branches comprises transistors 404, 410, respectively. The second circuit structure 415 has the common centre point 416 connected to the gates of transistors 404, 410, while the signal input is connected to the drains of transistors 402, 408, i.e. respective positive and negative differential input terminals. Thus, the second circuit structure 415 has connections to different pairs of branches for the collection of the output signal and for the control of output transistors. It should also be noted that the cross-connection of the output signals to the second circuit structure 415 here is necessary to provide the inverted output signal multiplied with respective input branch signal. FIG. 5 illustrates a low-noise amplifier 500 according to an embodiment. The low-noise amplifier 500 comprises an amplifier structure similar to what is demonstrated above, i.e. with a second circuit structure 515, and having a feedback impedance 502, 504 for respective parts. The low-noise amplifier 500 provides for improvements on third order input intercept point without degradation of noise and matching performance compared with a similar structure but without the second circuit structure 515.

Figure 6:
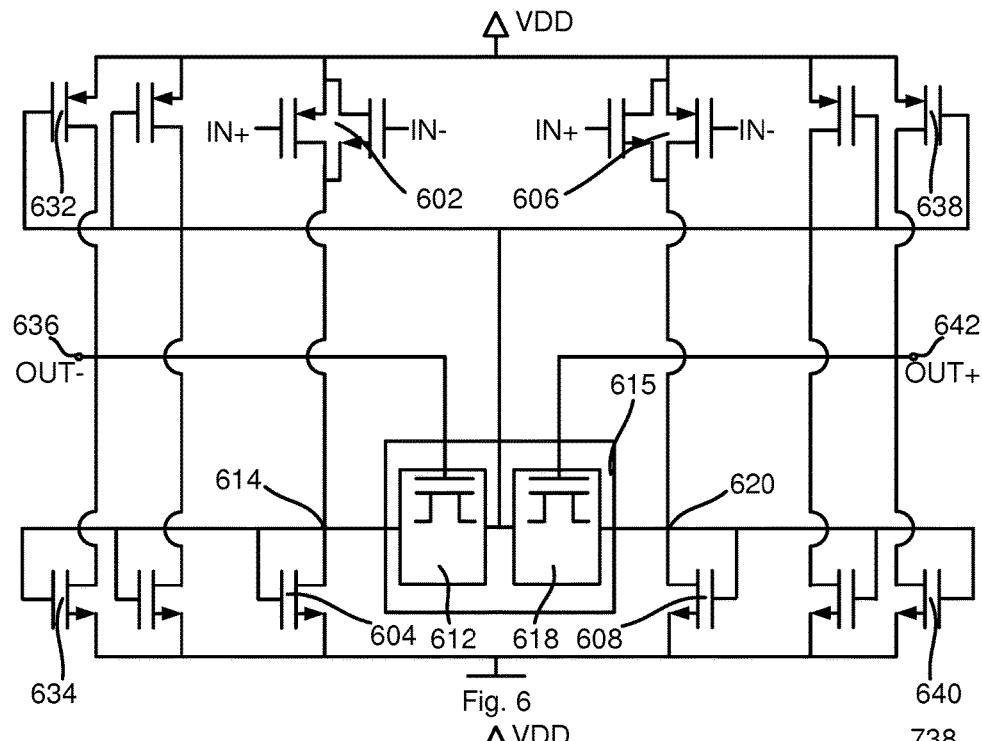
FIG. 6 schematically illustrates an operational transconductance amplifier according to an embodiment.

FIG. 6 schematically illustrates an operational transconductance amplifier 600 according to an embodiment. The first part of the operational transconductance amplifier 600 comprises a branch comprising an input transistor arrangement 602 for the first differential input terminal and a further transistor 604, wherein the first non-linear device 612 is connected to a signal point 614 at a point between the input transistor arrangement 602 and the further transistor 604 of that branch. The first part of the operational transconductance amplifier 600 further comprises another branch comprising a first transistor 632 and a second transistor 634 wherein a differential output terminal 636 is provided between the first and second transistors 632, 634. The second part comprises a branch comprising an input transistor arrangement 606 for the second differential input terminal and a further transistor 608, wherein the second non-linear device 618 is connected to a signal point 620 at a point between the input transistor arrangement 606 and the further transistor 608 of that branch. The another branch comprises a first transistor 638 and a second transistor 640 wherein another output terminal 642 is provided between the first and second transistors 638, 640. The control nodes of the first transistors 632, 638 of the another branches of the first and second parts are connected to the common centre node of a second circuit device 615. The second circuit device 615 comprises the first nonlinear device 612 which collects a signal from one output terminal 636, and the second nonlinear device 618 which collects a signal from another output terminal 642. The output terminals 636, 642 form the differential output of the amplifier 600.

Figure 7:
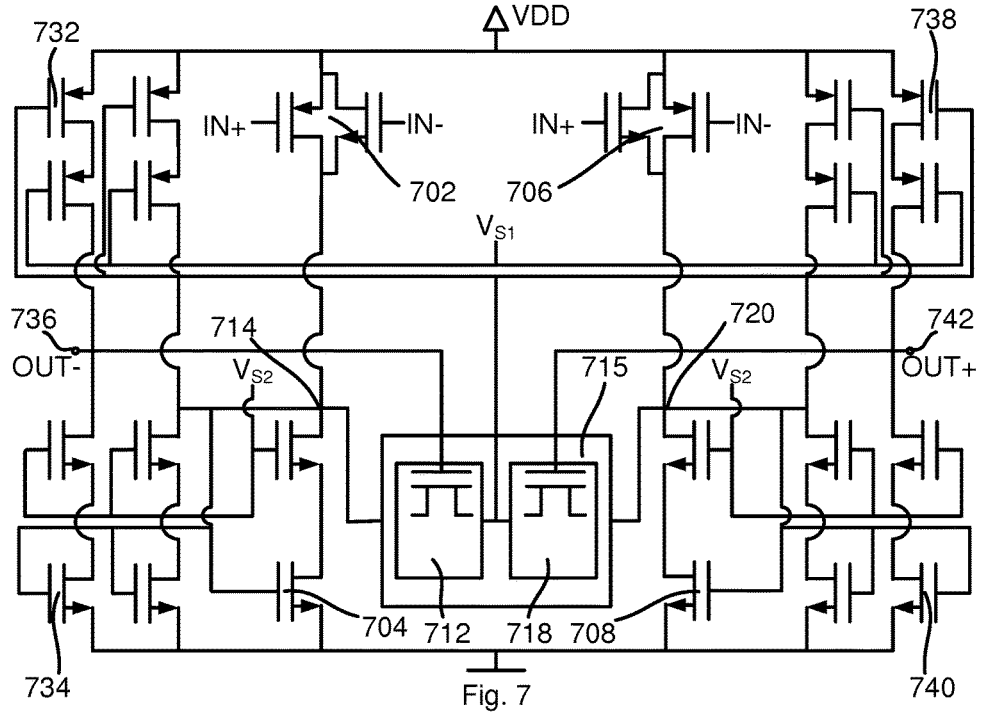
FIG. 7 schematically illustrates an operational transconductance amplifier according to an embodiment.

FIG. 7 schematically illustrates an operational transconductance amplifier 700 according to an embodiment. The first part of the operational transconductance amplifier 700 comprises a branch comprising an input transistor arrangement 702 for the first differential input terminal and a further transistor 704, wherein the first non-linear device 712 is connected to a signal point 714 at a point between the input transistor arrangement 702 and the further transistor 704 of that branch. The first part of the operational transconductance amplifier 700 further comprises another branch comprising a first transistor 732 and a second transistor 734 wherein a differential output terminal 736 is provided between the first and second transistors 732, 734. The second part comprises a branch comprising an input transistor arrangement 706 for the second differential input terminal and a further transistor 708, wherein the second non-linear device 718 is connected to a signal point 720 at a point between the input transistor arrangement 706 and the further transistor 708 of that branch. The another branch comprises a first transistor 738 and a second transistor 740 wherein another output terminal 742 is provided between the first and second transistors 738, 740. The control nodes of the first transistors 732, 738 of the another branches of the first and second parts are connected to the common centre node of a second circuit device 715. The second circuit device 715 comprises the first nonlinear device 712 which collects a signal from one output terminal 736, and the second nonlinear device 718 which collects a signal from another output terminal 742. The output terminals 736, 742 form the differential output of the amplifier 700. In that sense, the amplifier 700 resembles the one demonstrated with reference to FIG. 6. The amplifier 700 further comprises inputs for bias signals $V_{S1}$, $V_{S2}$ for further control of the amplifier 700.

Figure 8:
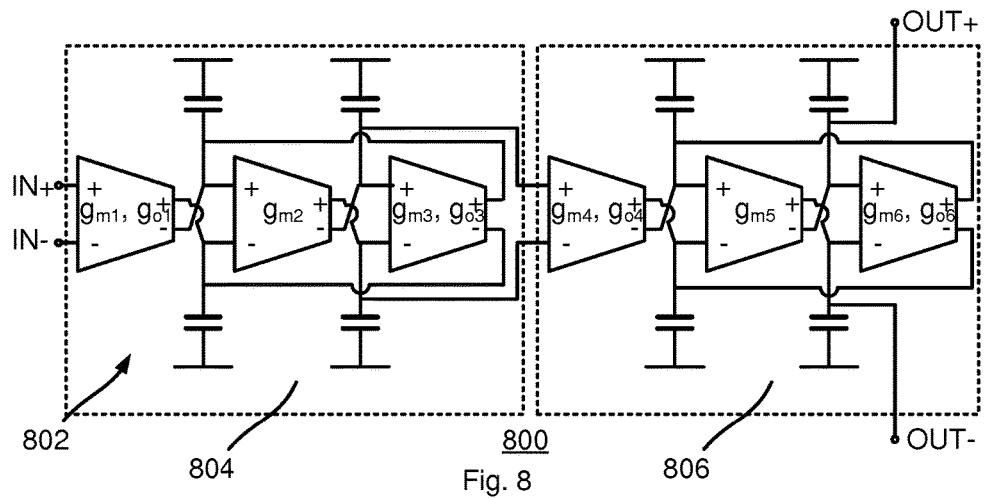
FIG. 8 schematically illustrates a filter according to an embodiment.
Figure 9:
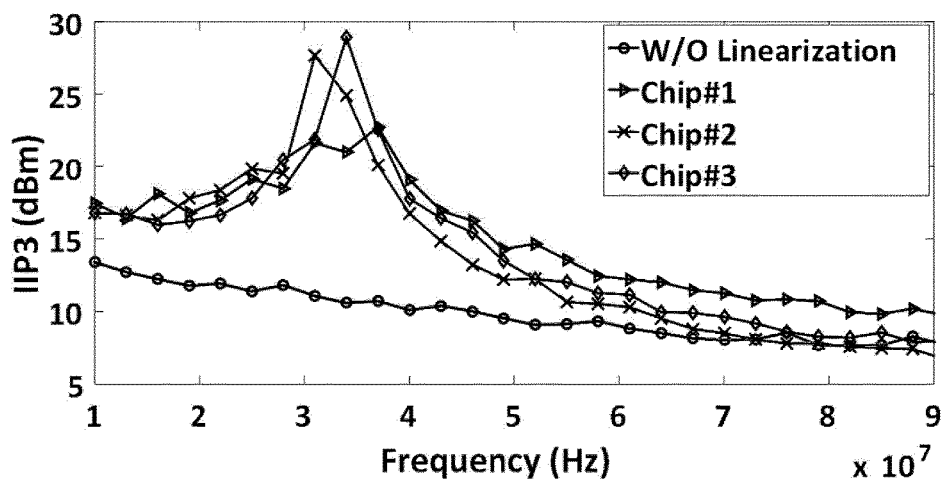
FIG. 9 is a diagram showing IIP3 measurements on a filter as of FIG. 8 compared with a corresponding filter without amplifier linearization according to embodiments.

FIG. 8 schematically illustrates a filter 800 according to an embodiment. The filter 800 comprises one or more biquad structures 804, 806 each comprising a plurality of operational transconductance amplifiers, e.g. as those demonstrated with reference to FIG. 6 or 7. For example, a fourth order gm-C filter employing this structure and with operational transconductance amplifiers having the second circuit structure as demonstrated above provides a significant improvement of third order input interception point (IIP3) compared with a similar structure without the above demonstrated linearization. FIG. 9 is a diagram showing IIP3 measurements on a filter as of FIG. 8 compared with a corresponding filter without amplifier linearization according to embodiments. The diagram is based on measurements on three different chip individuals and measurement on a solution without the linearization feature. As can be seen from the diagram, the improvement is of the magnitude of several dB, and at certain frequencies, i.e. frequencies for which the linearization solution has been adapted, the improvement is far more than that.

Figure 10:
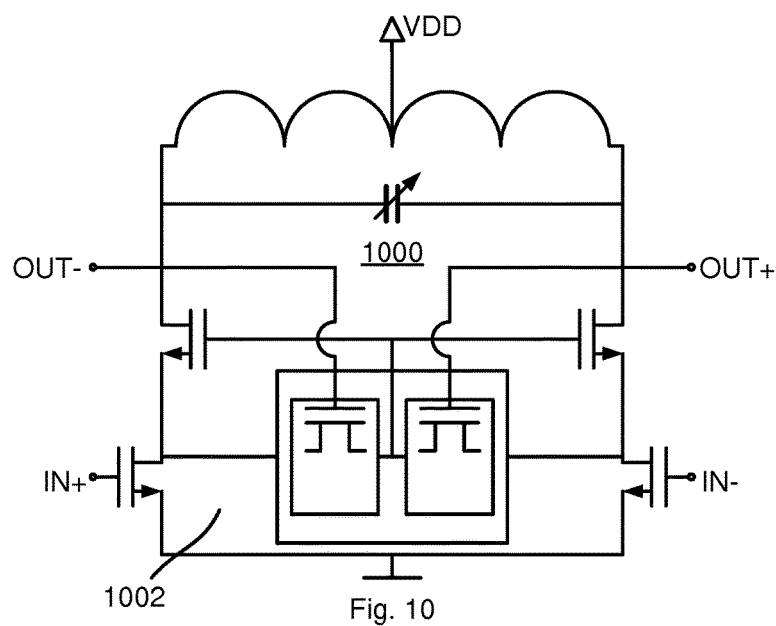
FIG. 10 schematically illustrates a driver stage for a power amplifier according to an embodiment.
Figure 11:
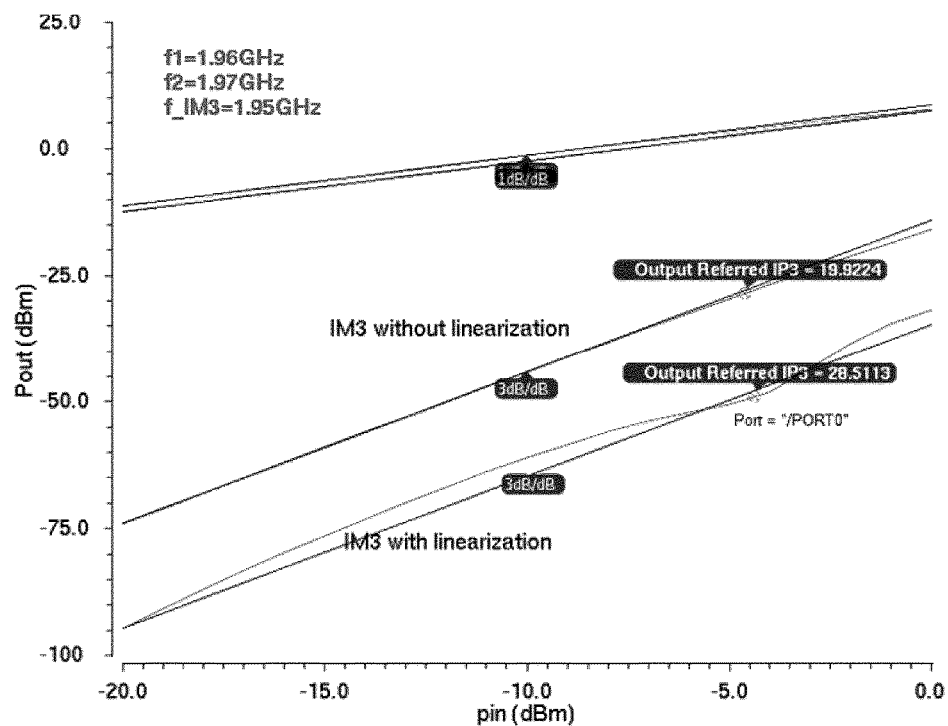
FIG. 11 is a diagram showing OIP3 results for the driver stage of FIG. 10 compared with a corresponding driver stage without amplifier linearization according to embodiments.

FIG. 10 schematically illustrates a driver stage 1000 for a power amplifier according to an embodiment, where a linearized amplifier 1002 employing the approach demonstrated above is used. Measurements on a solution according to FIG. 10 where thick oxide nMOS devices are used and can deliver an output power of more than 10 dBm show significant improvement of third order output interception point (OIP3). FIG. 11 is a diagram showing OIP3 results for the driver stage of FIG. 10 compared with a corresponding driver stage without amplifier linearization according to embodiments.

Figure 12:
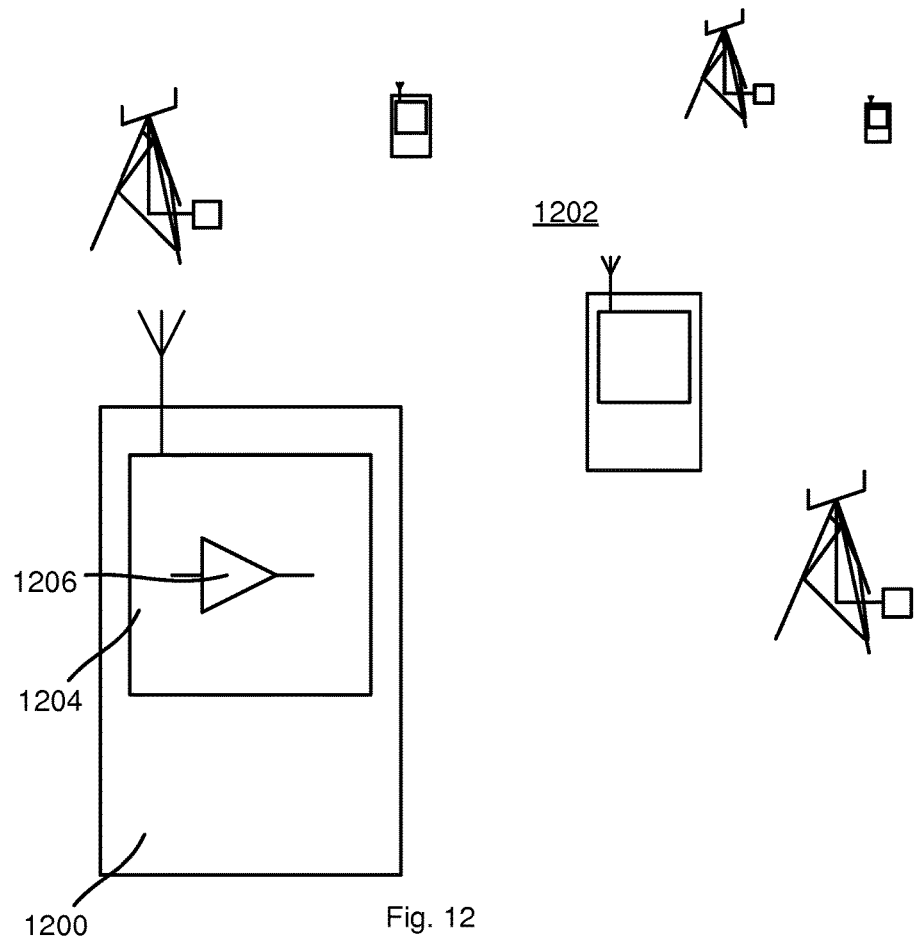
FIG. 12 schematically illustrates a communication device operating in a cellular communication system.

FIG. 12 schematically illustrates a communication device 1200 operating in a cellular communication system 1202. The communication device 1200 comprises radio circuitry 1204 which comprises a differential amplifier 1206 as demonstrated above. The communication device may be any type of wireless device capable of communicating with network node or another communication device over radio signals. The communication device may also be radio communication device, target device, device to device (D2D) communication device, machine type communication device or communication device capable of machine to machine communication (M2M), a sensor equipped with communication device PAD, Tablet, mobile terminals, smart phone, laptop embedded equipped (LEE), laptop mounted equipment (LME), USB dongles, Customer Premises Equipment (CPE), modem etc.

Figure 13:
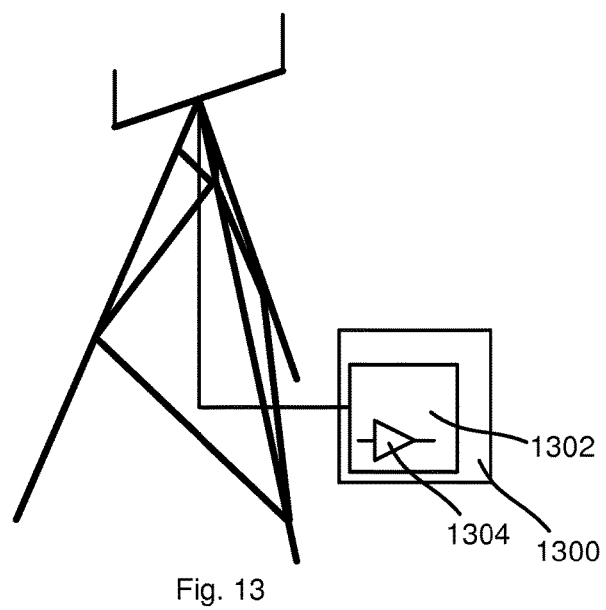
FIG. 13 schematically illustrates a network node operating in a cellular communication system.

FIG. 13 schematically illustrates a network node 1300 operating in a cellular communication system. The network node 1300 is configured to operate in a cellular communication system and comprises radio circuitry 1302 therefor. The radio circuitry 1302 comprises a differential amplifier 1304 as demonstrated above. The radio network node or simply network node (NW node) may be an eNodeB or any kind of network node, which may comprise base station, radio base station, base transceiver station, a centralized controller, a core network node, Mobility Management Entity (MME), base station controller, network controller, evolved Node B (eNB), Node B, Main eNodeB (MeNodeB), Secondary eNodeB (SeNodeB), relay node, access point, radio access point, Remote Radio Unit (RRU) Remote Radio Head (RRH) etc.

The invention claimed is:
1. A differential amplifier, comprising:
a first differential circuitry structure including a first part comprising at least one branch of transistors and a second part comprising at least one branch of transistors; and
a second circuitry structure comprising:
a first non-linear device connected between a signal point of a branch of the first part having a first differential input terminal of the differential amplifier and a common center node of the second circuitry structure; and
a second non-linear device connected between a signal point of a branch of the second part having a second differential input terminal of the differential amplifier and the common center node;
wherein the first non-linear device comprises a transistor having a control node connected to a first differential output terminal of the differential amplifier, wherein the first differential output terminal provides an inverted output in relation to the first differential input terminal; and
wherein the second non-linear device comprises a transistor having a control node connected to a second differential output terminal of the differential amplifier, wherein the second differential output terminal provides an inverted output in relation to the second differential input terminal; and
wherein the common center node is connected to a control node of one of the transistors of the branch of the first part having one of the differential output terminals, and connected to a control node of one of the transistors of the branch of the second part having the other differential output terminal.

2. The differential amplifier of claim 1:
wherein the first non-linear device comprises a first MOS transistor;
wherein the connection of the first non-linear device to the signal point of the branch of the first part having the first differential input terminal is a connection of a first node of the first MOS transistor, wherein the connection of the first non-linear device to the common center node is a connection of a second node of the first MOS transistor, and
wherein the transistor of the first non-linear device having the control node is the first MOS transistor having its gate connected to one of the differential output terminals; and
the second non-linear device comprises a second MOS transistor;
wherein the connection of the second non-linear device to the signal point of the branch of the second part having the second differential input terminal is a connection of a first node of the second MOS transistor, wherein the connection of the second non-linear device to the common center node is a connection of a second node of the second MOS transistor; and
wherein the transistor of the second non-linear device having the control node is the second MOS transistor having its gate connected to the other differential output terminal.

3. The differential amplifier of claim 2, wherein the first and second MOS transistors are operated in a triode region.

4. The differential amplifier of claim 1:
wherein the first part comprises a branch with a cascoded first transistor, and second transistor and biasing circuitry;
wherein the second part comprises a branch of a cascoded third transistor, and fourth transistor and biasing circuitry,
wherein the first and second differential input terminals are provided at control nodes of the first and third transistors, respectively; and
wherein the common center node is connected to control nodes of the second and fourth transistors.

5. The differential amplifier of claim 1, wherein the differential amplifier is configured as a balanced operational transconductance amplifier.

6. The differential amplifier of claim 5:
wherein the first part comprises:
a branch comprising an input transistor arrangement for the first differential input terminal and a further transistor; wherein the first non-linear device is connected to the signal point at a point between the input transistor arrangement and the further transistor of that branch; and
another branch comprising a first transistor and a second transistor, wherein the first differential output terminal is provided between the first and second transistors;
wherein the second part comprises:
a branch comprising an input transistor arrangement for the second differential input terminal and a further transistor; wherein the second non-linear device is connected to the signal point at a point between the input transistor arrangement and the further transistor of that branch; and another branch comprising a first transistor and a second transistor, wherein the second differential output terminal is provided between the first and second transistors; and
wherein the control nodes of the transistors to which the common center node is connected are control nodes of the first transistors of the another branches of the first and second parts.

7. The amplifier of claim 1, wherein a branch is a series connection of elements between a supply voltage node and a reference voltage node.

8. The amplifier of claim 7, wherein the reference voltage node is a ground node.

9. A low-noise amplifier, comprising:
a differential amplifier configured as a complementary amplifier, the differential amplifier comprising:
a first differential circuitry structure including a first part comprising at least one branch of transistors and a second part comprising at least one branch of transistors; and
a second circuitry structure comprising:
a first non-linear device connected between a signal point of a branch of the first part having a first differential input terminal of the differential amplifier and a common center node of the second circuitry structure; and
a second non-linear device connected between a signal point of a branch of the second part having a second differential input terminal of the differential amplifier and the common center node;
wherein the first non-linear device comprises a transistor having a control node connected to a first differential output terminal of the differential amplifier, wherein the first differential output terminal provides an inverted output in relation to the first differential input terminal; and
wherein the second non-linear device comprises a transistor having a control node connected to a second differential output terminal of the differential amplifier, wherein the second differential output terminal provides an inverted output in relation to the second differential input terminal; and
wherein the common center node is connected to a control node of one of the transistors of the branch of the first part having one of the differential output terminals, and connected to a control node of one of the transistors of the branch of the second part having the other differential output terminal;
a feedback network connected between inputs and outputs of the differential amplifier.

10. A filter, comprising:
a plurality of differential amplifiers, each of the differential amplifiers comprising:
a first differential circuitry structure including a first part comprising at least one branch of transistors and a second part comprising at least one branch of transistors; and
a second circuitry structure comprising:
a first non-linear device connected between a signal point of a branch of the first part having a first differential input terminal of the differential amplifier and a common center node of the second circuitry structure; and
a second non-linear device connected between a signal point of a branch of the second part having a second differential input terminal of the differential amplifier and the common center node;

wherein the first non-linear device comprises a transistor having a control node connected to a first differential output terminal of the differential amplifier, wherein the first differential output terminal provides an inverted output in relation to the first differential input terminal; and wherein the second non-linear device comprises a transistor having a control node connected to a second differential output terminal of the differential amplifier, wherein the second differential output terminal provides an inverted output in relation to the second differential input terminal; and wherein the common center node is connected to a control node of one of the transistors of the branch of the first part having one of the differential output terminals, and connected to a control node of one of the transistors of the branch of the second part having the other differential output terminal.

11. The filter of claim 10:
wherein the differential amplifiers are configured as operational transconductance amplifiers; and
wherein the filter further comprises one or more biquad structures employing the operational transconductance amplifiers.

12. A power amplifier, comprising:
a driver stage;
wherein the driver stage comprises a differential amplifier, the differential amplifier comprising:
a first differential circuitry structure including a first part comprising at least one branch of transistors and a second part comprising at least one branch of transistors; and
a second circuitry structure comprising:
a first non-linear device connected between a signal point of a branch of the first part having a first differential input terminal of the differential amplifier and a common center node of the second circuitry structure; and
a second non-linear device connected between a signal point of a branch of the second part having a second differential input terminal of the differential amplifier and the common center node;
wherein the first non-linear device comprises a transistor having a control node connected to a first differential output terminal of the differential amplifier, wherein the first differential output terminal provides an inverted output in relation to the first differential input terminal; and
wherein the second non-linear device comprises a transistor having a control node connected to a second differential output terminal of the differential amplifier, wherein the second differential output terminal provides an inverted output in relation to the second differential input terminal; and
wherein the common center node is connected to a control node of one of the transistors of the branch of the first part having one of the differential output terminals, and connected to a control node of one of the transistors of the branch of the second part having the other differential output terminal.

13. A communication apparatus configured to operate in a cellular communication system, the communication apparatus comprising:
radio circuitry;
wherein the radio circuitry comprises a differential amplifier, the differential amplifier comprising:
a first differential circuitry structure including a first part comprising at least one branch of transistors and a second part comprising at least one branch of transistors; and
a second circuitry structure comprising:
a first non-linear device connected between a signal point of a branch of the first part having a first differential input terminal of the differential amplifier and a common center node of the second circuitry structure; and
a second non-linear device connected between a signal point of a branch of the second part having a second differential input terminal of the differential amplifier and the common center node;
wherein the first non-linear device comprises a transistor having a control node connected to a first differential output terminal of the differential amplifier, wherein the first differential output terminal provides an inverted output in relation to the first differential input terminal; and
wherein the second non-linear device comprises a transistor having a control node connected to a second differential output terminal of the differential amplifier, wherein the second differential output terminal provides an inverted output in relation to the second differential input terminal; and
wherein the common center node is connected to a control node of one of the transistors of the branch of the first part having one of the differential output terminals, and connected to a control node of one of the transistors of the branch of the second part having the other differential output terminal.

14. A network node configured to operate in a cellular communication system, the network node comprising:
radio circuitry;
wherein the radio circuitry comprises a differential amplifier, the differential amplifier comprising:
a first differential circuitry structure including a first part comprising at least one branch of transistors and a second part comprising at least one branch of transistors; and
a second circuitry structure comprising:
a first non-linear device connected between a signal point of a branch of the first part having a first differential input terminal of the differential amplifier and a common center node of the second circuitry structure; and
a second non-linear device connected between a signal point of a branch of the second part having a second differential input terminal of the differential amplifier and the common center node;
wherein the first non-linear device comprises a transistor having a control node connected to a first differential output terminal of the differential amplifier, wherein the first differential output terminal provides an inverted output in relation to the first differential input terminal; and
wherein the second non-linear device comprises a transistor having a control node connected to a second differential output terminal of the differential amplifier, wherein the second differential output terminal provides an inverted output in relation to the second differential input terminal; and
wherein the common center node is connected to a control node of one of the transistors of the branch of the first part having one of the differential output terminals, and connected to a control node of one of the transistors of the branch of the second part having the other differential output terminal.

\* \* \* \* \*